(12) United States Patent
Kimbley

(10) Patent No.: US 7,010,849 B2
(45) Date of Patent: Mar. 14, 2006

(54) METHODS FOR MANUFACTURING A RESISTOR-PIN ASSEMBLY OF A VOLTAGE PROBE

(75) Inventor: David Nelson Kimbley, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 302 days.

(21) Appl. No.: 10/125,002

(22) Filed: Apr. 18, 2002

(65) Prior Publication Data

US 2003/0197517 A1    Oct. 23, 2003

(51) Int. Cl.
*H01C 17/02*    (2006.01)

(52) U.S. Cl. .................. 29/613; 29/619; 29/620; 29/842; 324/72.5; 324/149; 324/715; 439/482; 439/819

(58) Field of Classification Search .............. 29/613, 29/619, 620, 842; 439/482, 819; 324/72.5, 324/149, 715
See application file for complete search history.

(56) References Cited

U.S. PATENT DOCUMENTS

| | | | |
|---|---|---|---|
| 2,849,681 A * | 8/1958 | Belart ........................ 324/149 |
| 4,787,861 A * | 11/1988 | Kruger et al. ............... 439/482 |
| 6,603,297 B1 * | 8/2003 | Gessford et al. ........... 324/72.5 |

* cited by examiner

*Primary Examiner*—A. Dexter Tugbang
*Assistant Examiner*—Tim Phan

(57) ABSTRACT

A pin having a voltage probe pin-head is provided. The pin includes a pin-head having a substantially flat surface at one end and a pin-head tip at an opposing end, the substantially flat surface is configured to attach to a resistor, and the pin-head tip contacts an electrical test point. The pin also has a neck-like portion that extends between a shaft and the pin-head, wherein the neck-like portion is shorter than the shaft and has a diameter that is smaller than a diameter of a cross-section of the shaft.

30 Claims, 11 Drawing Sheets

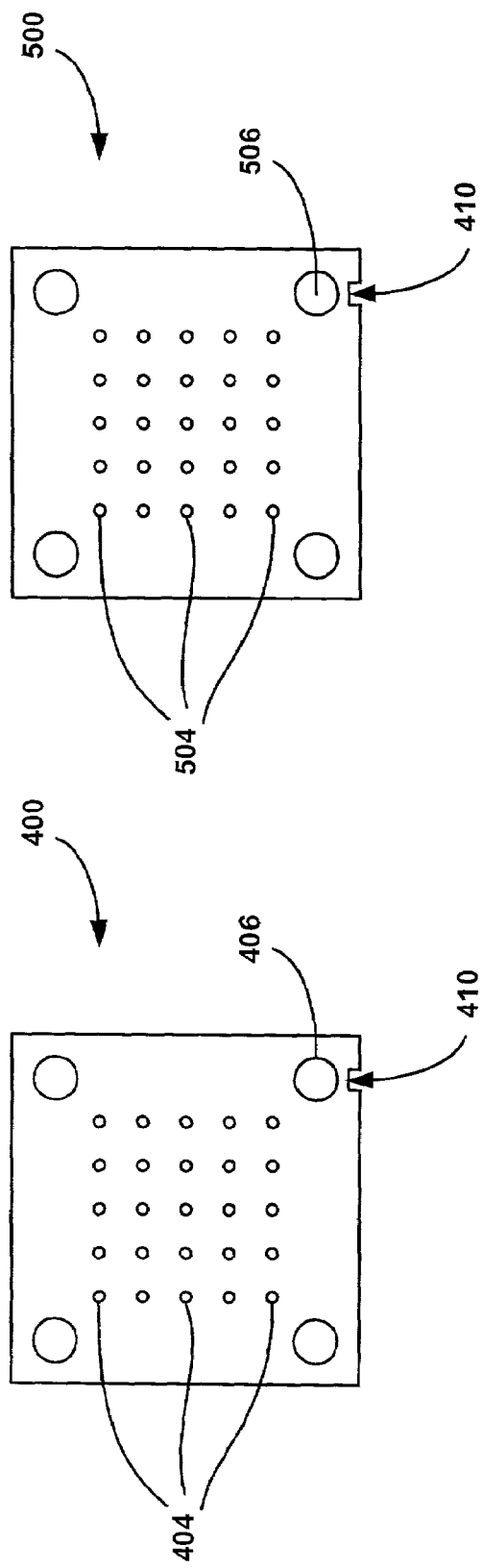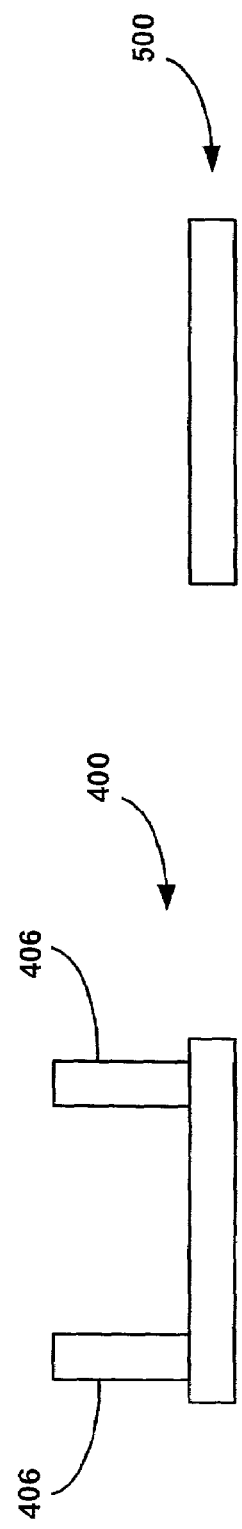

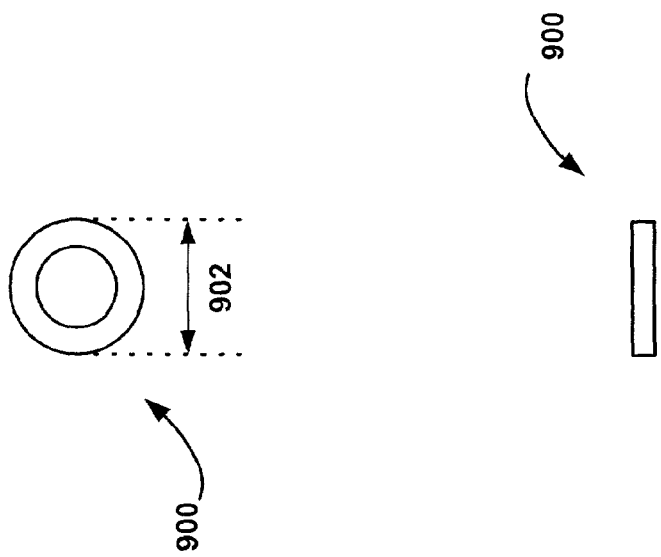
FIG. 9A  FIG. 9B
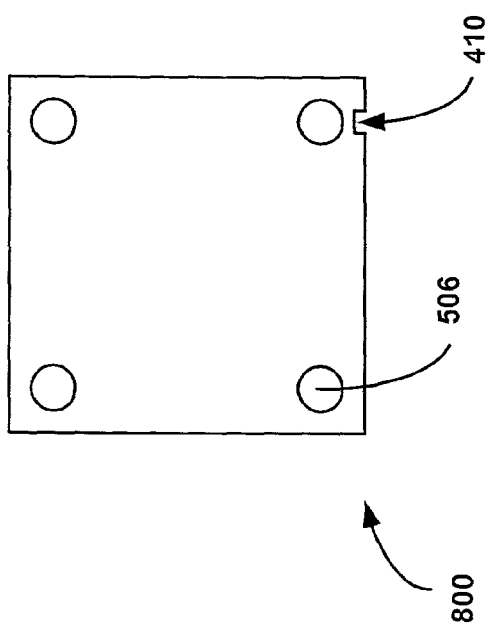
FIG. 8A  FIG. 8B

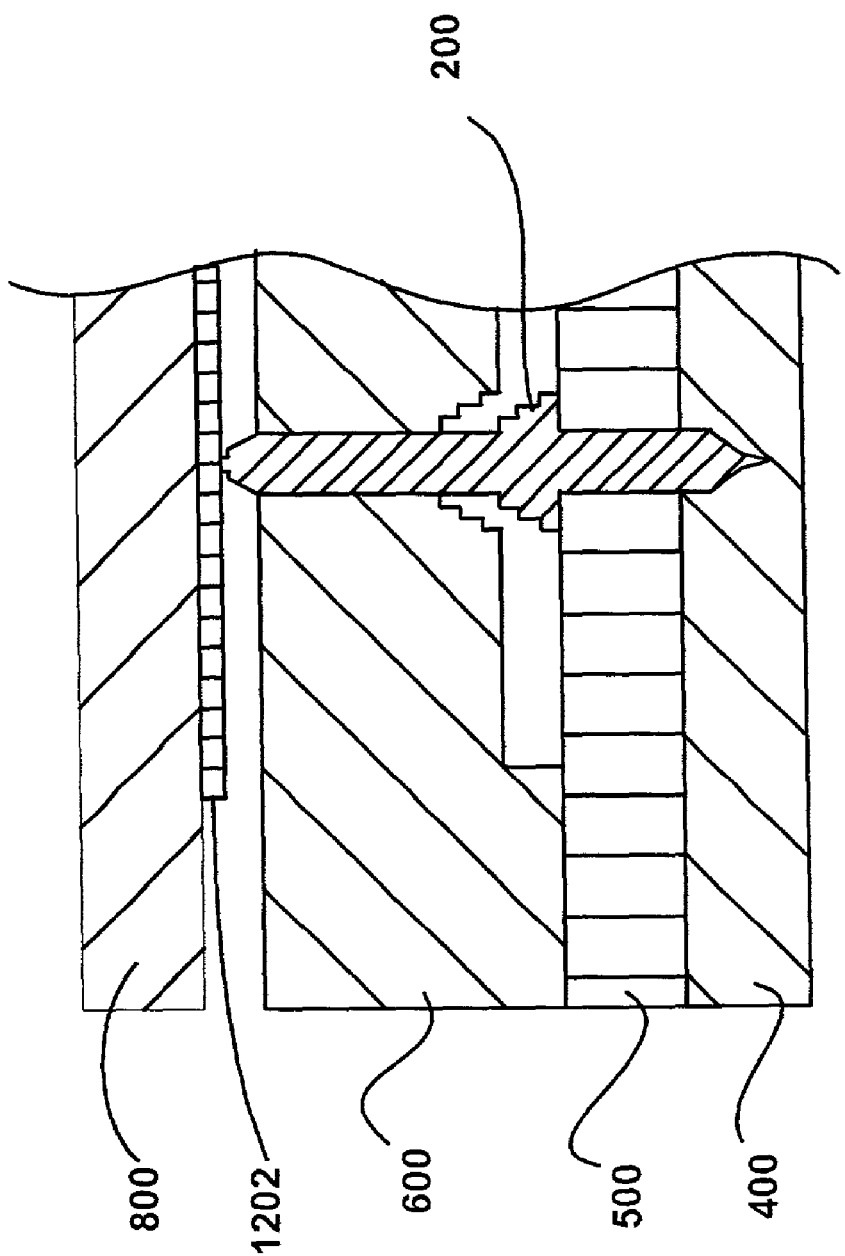

METHODS FOR MANUFACTURING A RESISTOR-PIN ASSEMBLY OF A VOLTAGE PROBE

FIELD OF THE INVENTION

This invention relates generally to instrumentation used in the testing and measuring of electrical signals. More specifically, the invention relates to systems and methods that use voltage probes for making electrical connections between signals under test and the inputs of test equipment.

DESCRIPTION OF THE RELATED ART

Wide bandwidth voltage probes can be categorized into three general types: low-impedance passive probes, active probes, and high-impedance passive probes. The most commonly used type of wide bandwidth voltage probe is the high-impedance passive probe. This probe type is rugged, reliable, simple to use, and inexpensive. For relatively low-frequency signals, including DC signals, these probes can present a very high-impedance load to the circuit under test. However, connecting this probe to a test signal can attenuate its higher frequency components thereby distorting it.

The simplest type of probe for high-bandwidth signals is the low-impedance, or low-Z, probe. This type of probe typically employs a 50 ohm coaxial cable that is connected to a 50 ohm input of the test instrument. The low-impedance passive probe type is rugged, reliable, and relatively inexpensive. It is also capable of very high bandwidth (well into the GHz frequency range). A drawback of this probe type is the significant load that it introduces to the circuit under test. This load can significantly alter the test signal, perhaps enough to cause a malfunction in the circuit being tested. Consequently, the low-impedance probe type is normally used only when a very high bandwidth is required and only for circuits that can tolerate the significant resistive load of these probes.

An active probe incorporates an amplifier circuit and provides a much higher input impedance than that of the low-impedance probe type. This input impedance corresponds to a relatively high resistance resistor that is in parallel with a small capacitance capacitor. Because of this capacitance, which may be on the order of 1 pF, the load impedance of the active probe is frequency dependent—being lower for the higher frequency components of a test signal. One advantage of the active probe is that it has a higher bandwidth capability than a high-impedance passive probe.

A voltage probe, whether it is a low-impedance, high impedance, or active type, has a limited bandwidth capability. In other words, it can only accurately relay signals having frequencies within a certain range. Furthermore, manufacturing a voltage probe having a desired higher bandwidth capability can be relatively costly. Based on the foregoing, it should be understood that there is a need for systems and methods that address these and/or other perceived shortcomings of the prior art. For instance, there exists a need for cost effective systems and methods for providing voltage probes having improved bandwidth capability, and/or components for such voltage probes.

SUMMARY OF THE INVENTION

Systems and methods for providing electrical connections to signals under test are disclosed. In one embodiment of the invention, the pin includes a pin-head having a substantially flat surface at one end and a pin-head tip at an opposing end. The substantially flat surface is configured to attach to a resistor, and the pin-head tip is configured to contact an electrical test point. The pin also has a neck-like portion that extends between a shaft and the pin-head. The neck-like portion is shorter than the shaft and has a diameter that is smaller than a diameter of a cross-section of the shaft.

In another embodiment of the invention, a method for manufacturing a resistor-pin assembly for use in a voltage probe includes providing a pin that has a shaft, a base, and a pin-head. The shaft extends between the base and the pin-head. The pin-head is separated from the shaft and is attached to a resistor.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following drawings. The components in the drawings are not necessarily drawn to scale, emphasis instead being placed upon clearly illustrating the principles of the present invention. In the drawings, like reference numerals designate corresponding parts throughout the several views.

FIGS. 4A and 4B are schematic diagrams depicting a top view and a side view, respectively, of a first slab used in manufacturing the resistor-pin assembly shown in FIG. 2.

FIGS. 5A and 5B are schematic diagrams depicting a top view and a side view, respectively, of a second slab used in manufacturing the resistor-pin assembly shown in FIG. 2.

FIGS. 8A and 8B are schematic diagrams depicting a top view and a side view, respectively, of a fourth slab used in manufacturing the resistor-pin assembly shown in FIG. 2.

FIGS. 9A and 9B are schematic diagrams depicting a top view and a side view, respectively, of a solder washer that may be used to bond a resistor to the pin-head or base of the pin shown in FIG. 1.

FIG. 12 is a schematic diagram illustrating a partial cross-sectional view of the slab assembly shown in FIG. 11.

DETAILED DESCRIPTION

One way to improve the bandwidth capability of a voltage probe is to place a resistor within the voltage probe in such a way that it is very close to (e.g., within about 1 mm from) a test point that is contacted by the voltage probe. This may involve making a tiny pin-head for contacting the test point, attaching the tiny pinhead to one end of a resistor, and connecting the other end of the resistor to another voltage probe component. However, such a tiny pin-head would be about the size of a grain of sand and would therefore be very difficult to properly handle, even with a pair of tweezers. Therefore, an embodiment of the invention provides a pin having a pin-head that can be easily separated from the remainder of the pin during the manufacturing of a resistor-pin assembly. In this manner, the pin may be used to easily handle and manipulate the pin-head during the manufacturing process. Furthermore, the shaft and base of the pin may be configured to form a component of the resistor-pin assembly, thereby further reducing manufacturing costs.

Select embodiments of the present invention now will be described with reference to the accompanying drawings. These embodiments are examples, among others, of systems and methods of the present invention. Therefore, the present invention, which may be embodied in many different forms, should not be construed as limited to the embodiments set forth herein.

Figure 1:
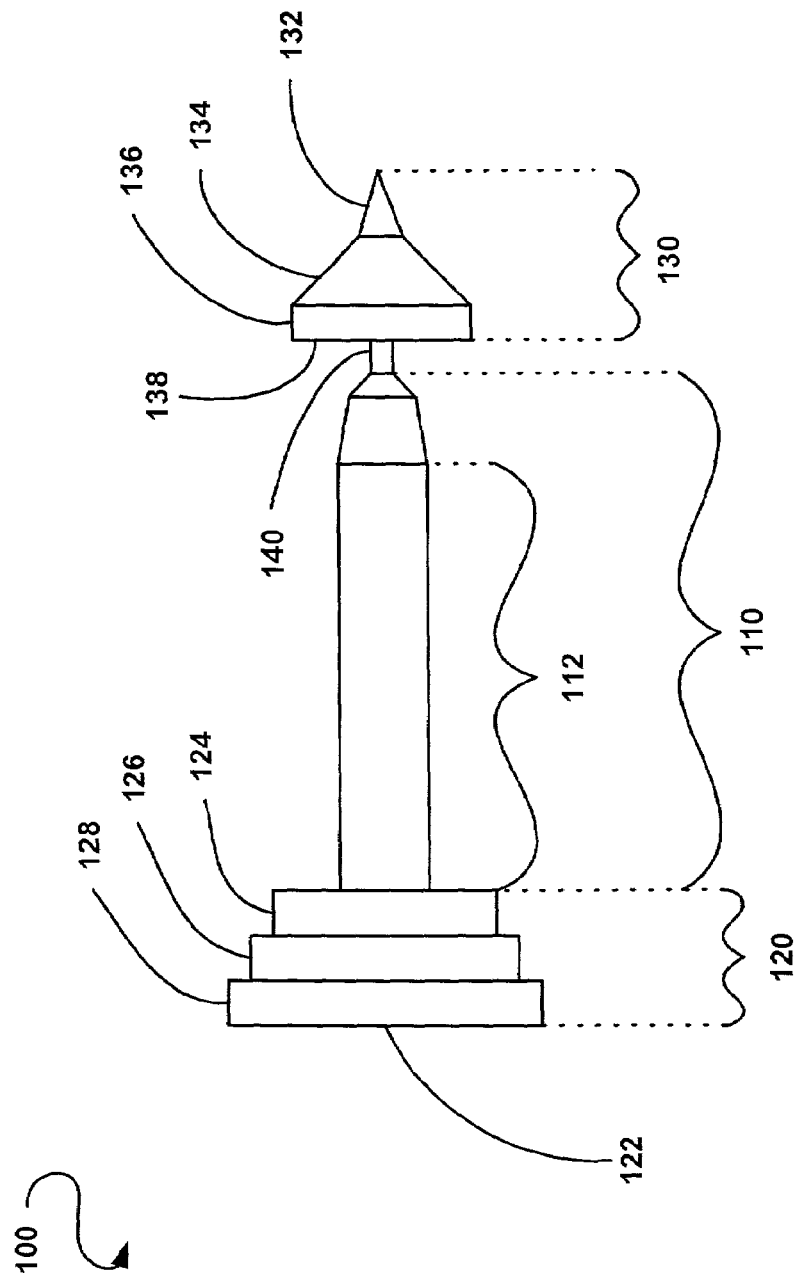
FIG. 1 is a schematic diagram depicting a pin in accordance with one embodiment of the invention.

FIG. 1 is a schematic diagram depicting a pin 100. The pin 100 may be used to form a pin assembly that can be incorporated into a voltage probe. The pin 100 is preferably only a few millimeters (mm) in length. In one embodiment, for example, among others, the pin is about 7 mm long. The exact length of a pin 100 may be determined based on a desired implementation.

The pin 100 includes a shaft 110, a base 120, a pin-head 130, and a neck 140. The shaft 110 extends between the base 120 and the neck 140. The neck 140 extends between the pin-head 130 and the shaft 110, and has a significantly smaller diameter than a diameter of at least a portion of the shaft 110. As a result, the neck 140 can break when a sufficient level of torque, for example, is exerted on the pin 100.

The pin-head 130 includes a pin-head tip 132 for contacting an electrical test point, and a conical portion 134 that extends from the pin-head tip 132. The combination of the pin-head tip 132 and the conical portion 134 is durable and helps to provide good visibility of an electrical test point during testing. The pin-head 130 and the base 120 include substantially flat surface areas 138 and 122, respectively, that are configured to bond to a resistor via, for example, but not limited to, soldering material.

The base 120 may include three cylindrical portions having different diameters: a first cylindrical portion 124 for fitting within a voltage probe socket, a second cylindrical portion 126 for contacting an area surrounding an opening of the voltage probe socket, and a third cylindrical portion 128 for helping to secure a protective cast that is applied to a portion of the pin 100 during the manufacturing of a resistor-pin assembly.

In one embodiment, the pin may comprise a Beryllium-copper (BeCu) alloy and may be shaped using a numerically controlled lathe. Other conductive materials may also be used. However, one advantage of using a BeCu alloy is that it can be relatively soft and therefore easy to shape. Furthermore, after the BeCu is shaped, it may then be heat treated to substantially increase its durability.

The exact dimensions of the pin 100 may be responsive to a desired implementation. For example, the diameter of a cylindrical portion 136 of the pin-head 130 may be selected to equal a diameter of a resistor that is to be attached to the substantially flat surface area 138. Furthermore the diameters of the shaft 110 and of a first portion 124 of the base 120 may be selected such that the parts can properly fit within a socket of a desired voltage probe.

It may be desirable to keep the length of the pin-head 130 very short (e.g., less than or equal to 1 mm) in order to optimize the performance of a voltage probe for ultra-high and super-high frequency applications. However, it may be more practical to manufacture and use a resistor-pin assembly having a pin-head 130 that is slightly longer than 1 mm (e.g., between 1 mm and 1.5 mm) without significantly departing from optimal performance.

Figure 2:
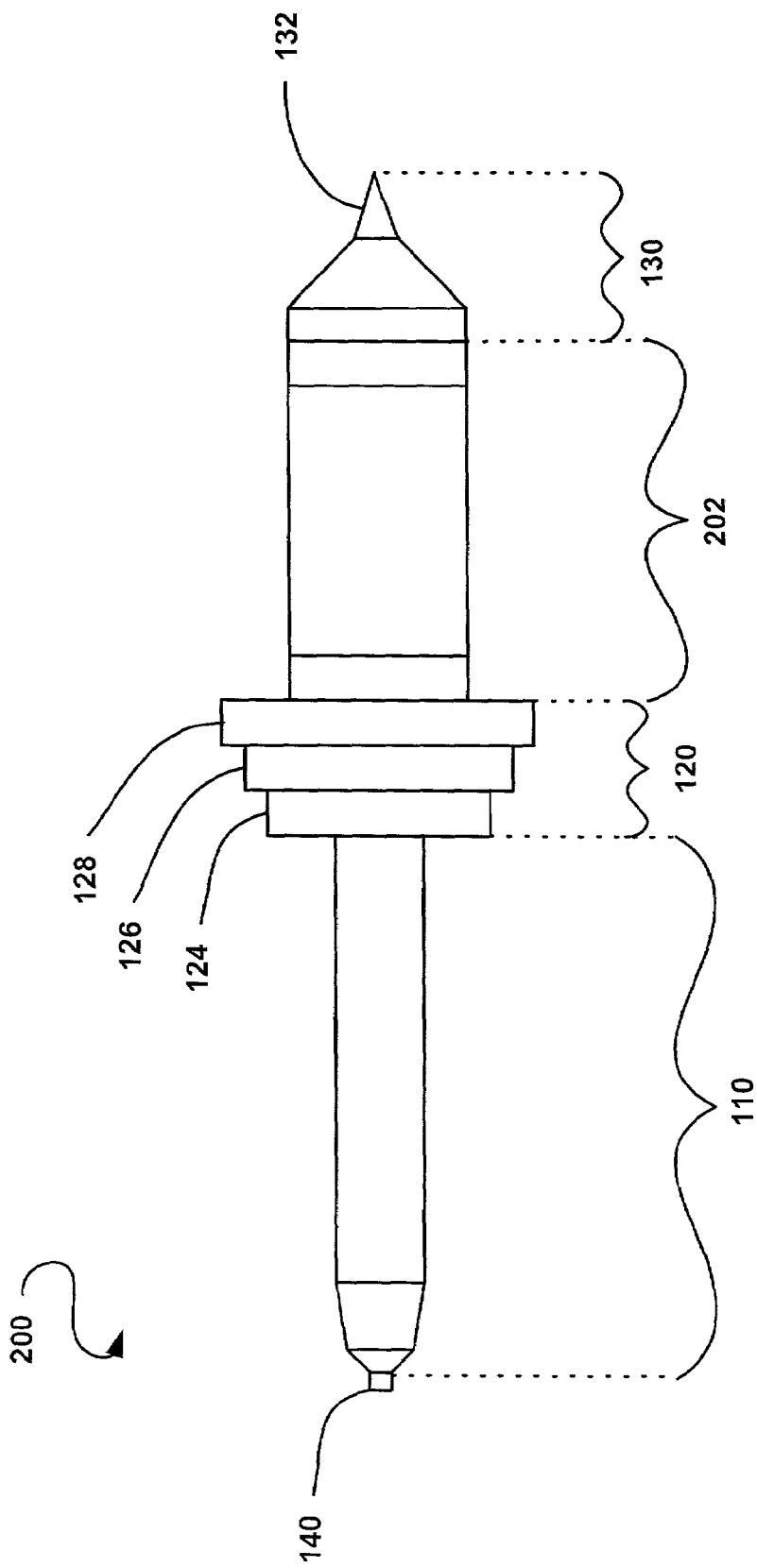
FIG. 2 is a schematic diagram depicting a resistor-pin assembly comprising the pin shown in FIG. 1.

FIG. 2 is a schematic diagram depicting a resistor-pin assembly 200. The resistor-pin assembly 200 is assembled after the neck 140 (FIG. 1) is broken to separate the shaft 110 from the pin-head 130. When the neck 140 is broken, a portion of it may remain connected to the pin-head 130 and another portion may remain connected to the shaft 110. The resistor-pin assembly 200 includes the pin-head 130, the base 120 and the shaft 110 of the pin 100. A resistor 202 is attached to the substantially flat surface area 138 of the pin-head 130 and to the substantially flat surface area 122 of the base 120 (FIG. 1) via solder material. The resistor 202 is preferably a Metal Electrode Leadless Face (MELF) resistor. Note that the resistor-pin assembly 200 may include a pin-head 130 corresponding to a first pin 100 and a shaft 110 and a base 120 corresponding to a second pin 100.

Figure 3:
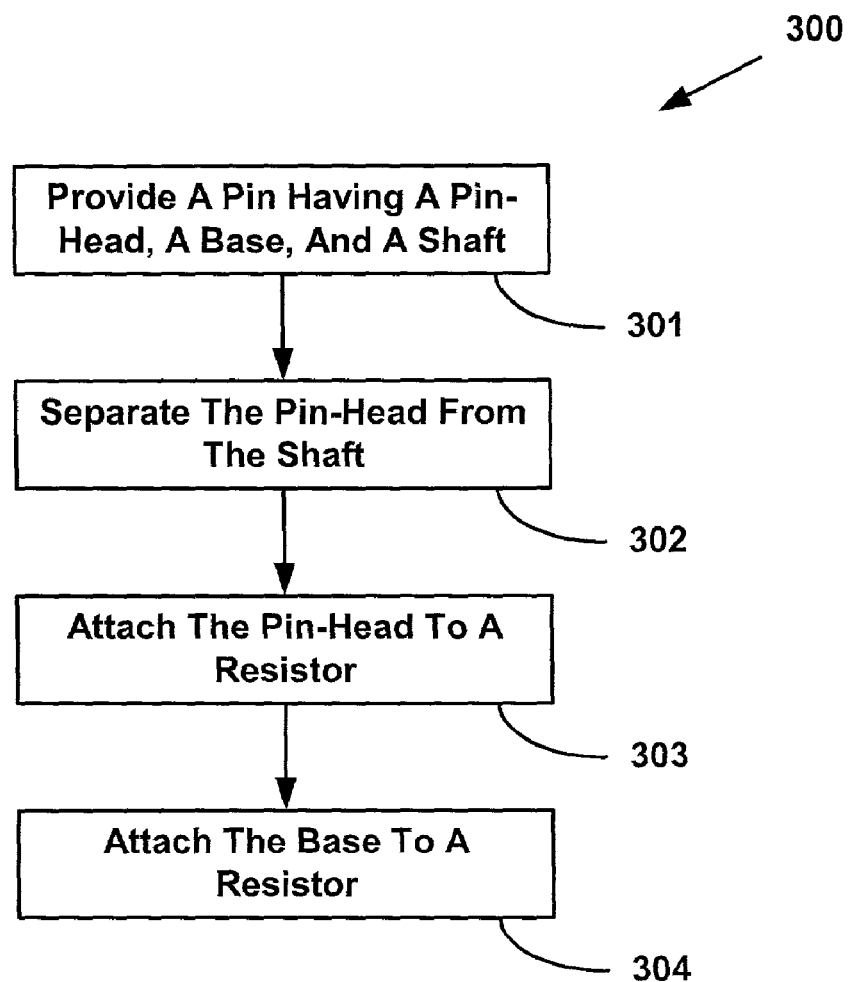
FIG. 3 is a flow chart depicting a method for manufacturing the resistor-pin assembly shown in FIG. 2.

FIG. 3 is a flow chart depicting a method 300 for manufacturing a resistor-pin assembly 200 (FIG. 2). As indicated in block 301, a pin 100 (FIG. 1) having a pinhead 130, a base 120, and a shaft 10 is provided. The pin-head 130 is separated from the shaft 110 (block 302) and is attached to a resistor 202 (block 303). The base 120 of the pin 100 may be attached to the same resistor 202 or to a different resistor (block 304). Note that the blocks or steps depicted in the FIG. 3 may be performed out of order from that shown or discussed, including substantially concurrently or in reverse order, depending on the functionality involved, as would be understood by those reasonably skilled in the art. Furthermore, in an alternative embodiment, the method 300 may be implemented using fewer, additional, and/or modified steps.

FIGS. 4A and 4B are schematic diagrams depicting a top view and a side view, respectively, of a first slab 400 used in manufacturing the resistor-pin assembly 200 (FIG. 2). The first slab 400 has holes 404 formed therein for receiving pin-heads such as, for example, the pin-head 130 (FIG. 1). The first slab 400 also has alignment pins 406 extending therefrom. Each of the alignment pins 406 is located near a corner of the first slab 400 and is configured to fit through alignment holes provided in other slabs that are to be placed above the first slab 400. The first slab 400 also has an alignment notch 410 that helps to align the first slab 400 with the other slabs.

FIGS. 5A and 5B are schematic diagrams depicting a top view and a side view, respectively, of a second slab 500 used in manufacturing the resistor-pin assembly 200 (FIG. 2). The second slab 500 has holes 504 formed therein for receiving resistors, such as, for example, the resistor 202 (FIG. 2). The second slab 500 also has alignment holes 506. Each alignment hole 506 is located near a corner of the second slab 500 and is configured to receive one of the alignment pins 406 that extends from the first slab 400 (FIG. 4).

Figure 6A:
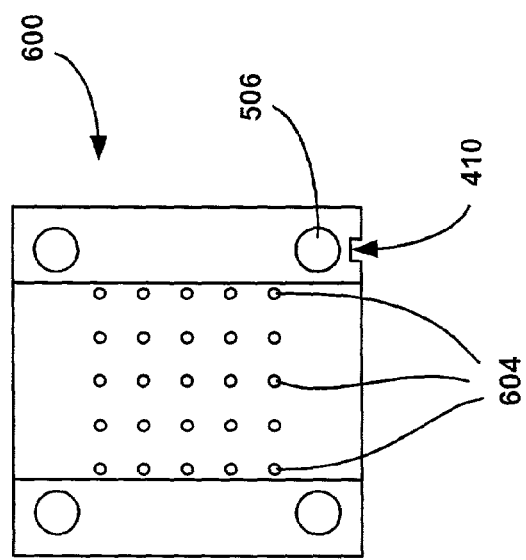
FIGS. 6A and 6B are schematic diagrams depicting a top view and a side view, respectively, of a third slab used in manufacturing the resistor-pin assembly shown in FIG. 2.
Figure 6B:
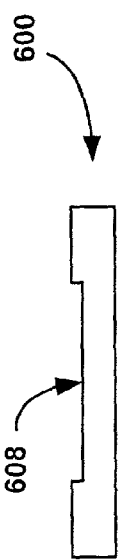

FIGS. 6A and 6B are schematic diagrams depicting a top view and a side view, respectively, of a third slab 600 used in manufacturing the resistor-pin assembly 200 (FIG. 2). The third slab 600 has holes 604 formed therein for receiving the body of a pin such as for example, the shaft 110 and the base 120 of the pin 100 (FIG. 1). The third slab 600 also has alignment holes 506 and a slot 608. Each alignment hole 506 is located near a corner of the third slab 600 and is configured to receive one of the alignment pins 406 that extends from the first slab 400 (FIG. 4). The slot 608 is configured to receive a slide that is configured to keep the shaft 110 and base 120 within the third slab 600 while the third slab 600 is being turned upside down.

Figure 7B:
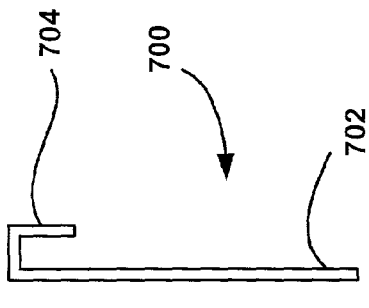
FIGS. 7A and 7B are schematic diagrams depicting a top view and a side view, respectively, of a slide used in manufacturing the resistor-pin assembly shown in FIG. 2.
Figure 7A:
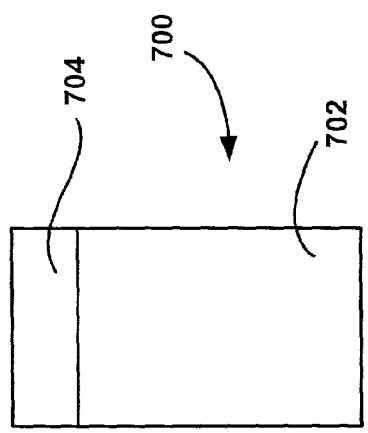
Figure 7C:
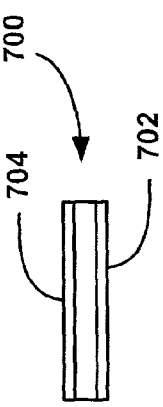

FIGS. 7A, 7B, and 7C are schematic diagrams depicting a top view, a side view, and an end view, respectively, of a slide 700 used in manufacturing the resistor-pin assembly 200 (FIG. 2). A first portion 702 of the slide 700 is configured to slide into the slot 608 of the third plate 600. A second portion 704 of the slide 700 is configured to slide on an opposing side of the third plate 600.

FIGS. 8A and 8B are schematic diagrams depicting a top view and a side view, respectively, of a fourth slab 800 used in manufacturing the resistor-pin assembly 200 (FIG. 2). The fourth slab 800 has alignment holes 506 extending therethrough. Each alignment hole 506 is located near a corner of the fourth slab 800 and is configured to receive one of the alignment pins 406 that extends from the first slab 400 (FIG. 4). The fourth slab 800 is relatively heavy and is used to provide pressure on resistor-pin assemblies positioned within a slab assembly comprising the four slabs 400, 500, 600, and 800.

FIGS. 9A and 9B are schematic diagrams depicting a top view and a side view, respectively, of a solder washer 900 that may be used to bond a resistor 202 to a pin-head 130 or to a base 120. The solder washer 900, which comprises solder material, is very thin. In one implementation, for example, the solder washer is about 1/10 of a millimeter thick, and has an exterior diameter 902 that is equal to the diameter of the cylindrical portion 136 of the pin-head 130 (FIG. 1). Furthermore, the solder washer 900 is preferably coated with a solid layer of flux to facilitate the flowing of solder and to help prevent formation of oxides during the soldering process.

Figure 10:
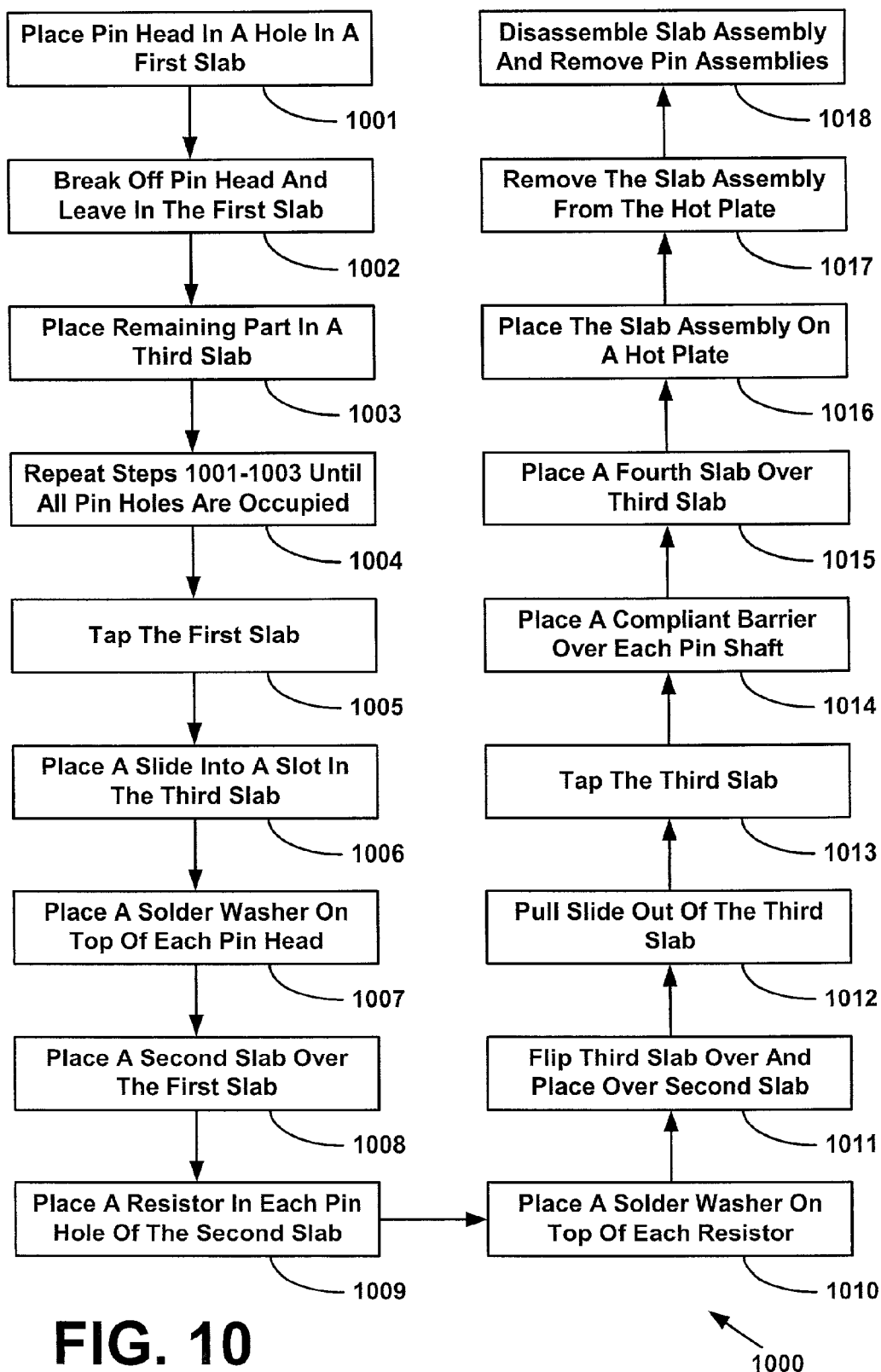
FIG. 10 is a flow chart depicting a method for manufacturing a resistor-pin assembly shown in FIG. 2.

FIG. 10 is a flow chart depicting a method for manufacturing a resistor-pin assembly 200 (FIG. 2). The blocks or steps depicted in the FIG. 10 may be performed out of order from that shown or discussed, including substantially concurrently or in reverse order, depending on the functionality involved, as would be understood by those reasonably skilled in the art. As indicated in block 1001, a pin-head 130 that is part of a pin 100 (FIG. 1) is placed in a pin hole in a first slab 400 (FIG. 4A). The pin-head 130 is then broken off from the remainder of the pin and is left in the first slab 400 (block 1002). The remainder of the pin (e.g., the shaft 110 and the base 120) is placed in a third slab 600 (FIG. 6A) with the base 120 facing up (block 1003). The steps indicated in blocks 1001–903 are repeated until all the pin holes for receiving pin portions are occupied (block 1004). After all such pin holes are occupied, the first slab 400 may be tapped (block 1005) to insure that the pin-heads 130 are settled into the pin holes in the first slab 400.

A first portion 702 of a slide 700 (FIG. 7) is placed into the slot 608 in the third slab 600 (block 1006) to help ensure that the pin portions inside the third slab 600 do not fall out when the third slab 600 is turned upside down. Furthermore, a solder washer 900 (FIG. 9) is placed on top of each pin-head 130 in the first slab 400 (block 1007). The solder washers 900 are for bonding the pin-heads 130 with respective resistors that are to be positioned over the pin-heads 130.

After the solder washers 900 are placed on top of respective pin-heads 130, the second slab 500 (FIG. 5A) is placed over the first slab 400 (block 1008). The alignment pins 406 are placed through the alignment holes 506 of the second slab 500 in order to align the two slabs. Furthermore, the first slab 400 and the second slab 500 are positioned such that alignment notches 410 in the two slabs are aligned.

After the second slab 500 is placed over the first slab 400, a resistor is placed in each of the pin holes of the second slab 500 (block 1009) and a solder washer is placed over each of the resistors (block 1010). The third slab 600 is then turned upside down and is placed over the second slab 500 (block 1011). The alignment pins 406 are placed through the alignment holes 506 of the third slab 600 in order to align the third slab 600 with the second slab 500. Furthermore, the second slab 500 and the third slab 600 are positioned such that alignment notches 410 in the two slabs are aligned.

The slide 700 that was inserted into the slot 608 of the third slab 600 is then removed (block 1012) so that the bases of the pins contained in the third slab 600 come into contact with respective solder washers 900 located on top of the resistors in the second slab 500. The third slab 600 may also be tapped (block 1013) to insure that the bases settle onto the solder washers 900.

A compliant barrier is placed over the necks 140 that extend from pin shafts 110 positioned through pin holes in the third slab 600 (block 1014). The compliant barrier may comprise, for example, but not limited to, rubber. Then, as indicated in bock 1015, the fourth slab 800 (FIG. 8A) is placed over the third slab 600 in order to apply pressure on resistor-pin assemblies located within the slab assembly. The alignment pins 406 are placed through the alignment holes 506 of the fourth slab 800 in order to align the fourth slab 800 with the third slab 600. Furthermore, the fourth slab 800 and the third slab 600 are positioned relative to each other such that alignment notches 410 in the two slabs are aligned.

The compliant barrier transfers pressure applied by the fourth slab 800 (FIG. 8A) to the resistor-pin assemblies. This pressure helps to ensure that components of the resistor-pin assembly are firmly pressed against each other during a soldering process. In the absence of the compliant barrier, pin assemblies that are slightly shorter than others may receive little or no pressure from the fourth slab 800.

The slab assembly comprising the four slabs is then placed on a hot plate (block 1016) in order to melt the solder washers 900. The slab assembly is then removed from the hot plate and is allowed to cool (block 1017). Cooling the slab causes the resistors to bond with respective pin-heads 130 and pin bases that are positioned within the slab assembly. After the slab assembly has cooled enough to be handled, it is disassembled and the resistor-pin assemblies 200 are removed therefrom (block 1018).

Figure 11:
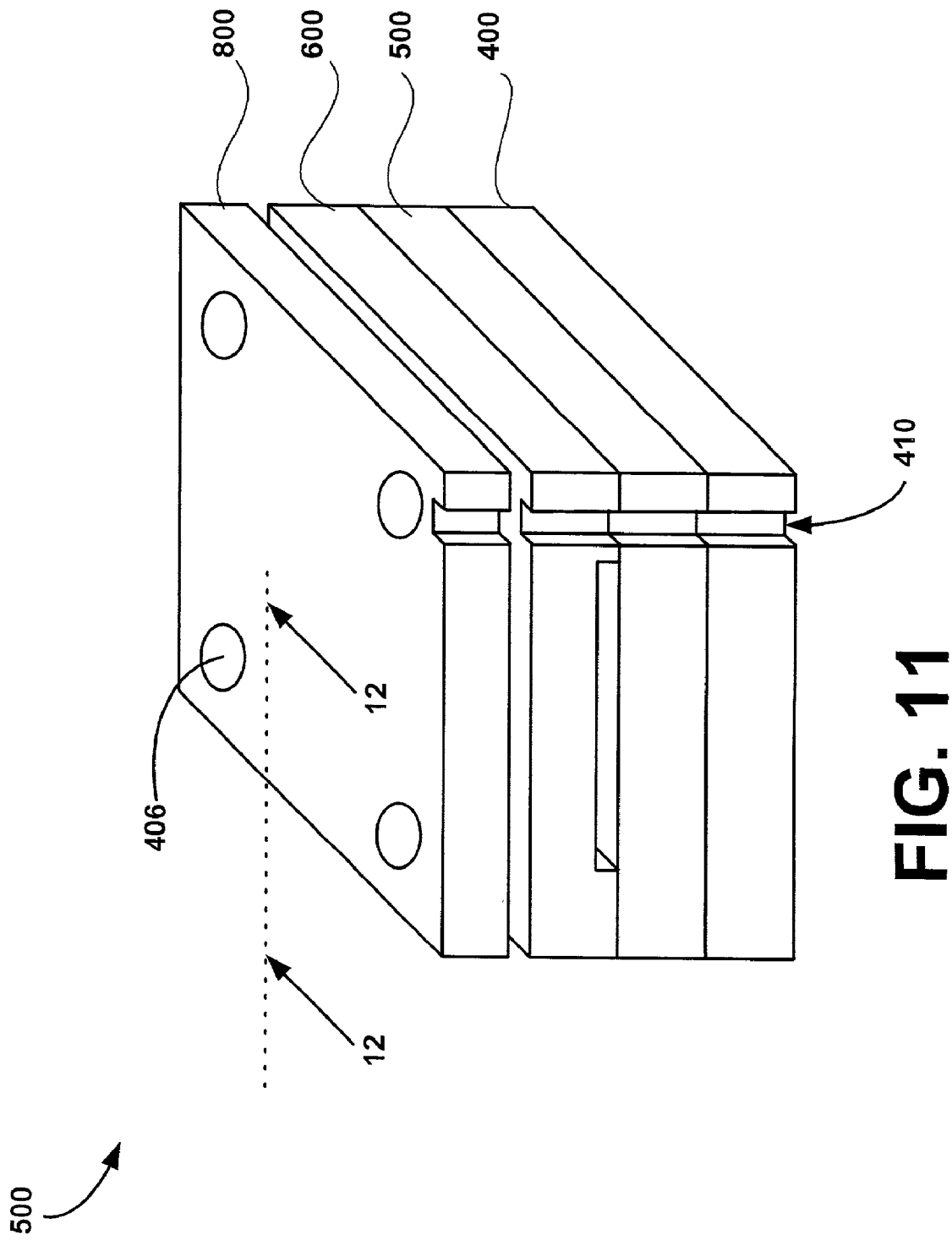
FIG. 11 is a schematic diagram illustrating a perspective view of a slab assembly comprising components shown in FIGS. 4–8.

FIG. 11 is a schematic diagram illustrating a perspective view of a slab assembly 1100. The slab assembly 1100 includes a first slab 400, a second slab 500, a third slab 600, and a fourth slab 800. The slabs 400, 500, 600, and 800 preferably comprise titanium which resists adhesion to solder material. Alignment pins 406 and alignment notches 410 help to ensure that the slabs are properly aligned.

FIG. 12 is a schematic diagram illustrating a partial cross-sectional view of the slab assembly 1100. The slab assembly 1100 includes a resistor-pin assembly 200 and a compliant barrier 1202 that is positioned between the resistor-pin assembly 200 and the fourth slab 800. The fourth slab 800 applies pressure on the resistor-pin assembly 200 via the compliant barrier 1202. This pressure helps to ensure that components of the resistor-pin assembly 200 are firmly pressed against each other during a soldering process. The soldering process includes heating the slab assembly 1100 in order to melt solder that is located between components of the resistor-pin assembly 200.

Figure 13A:
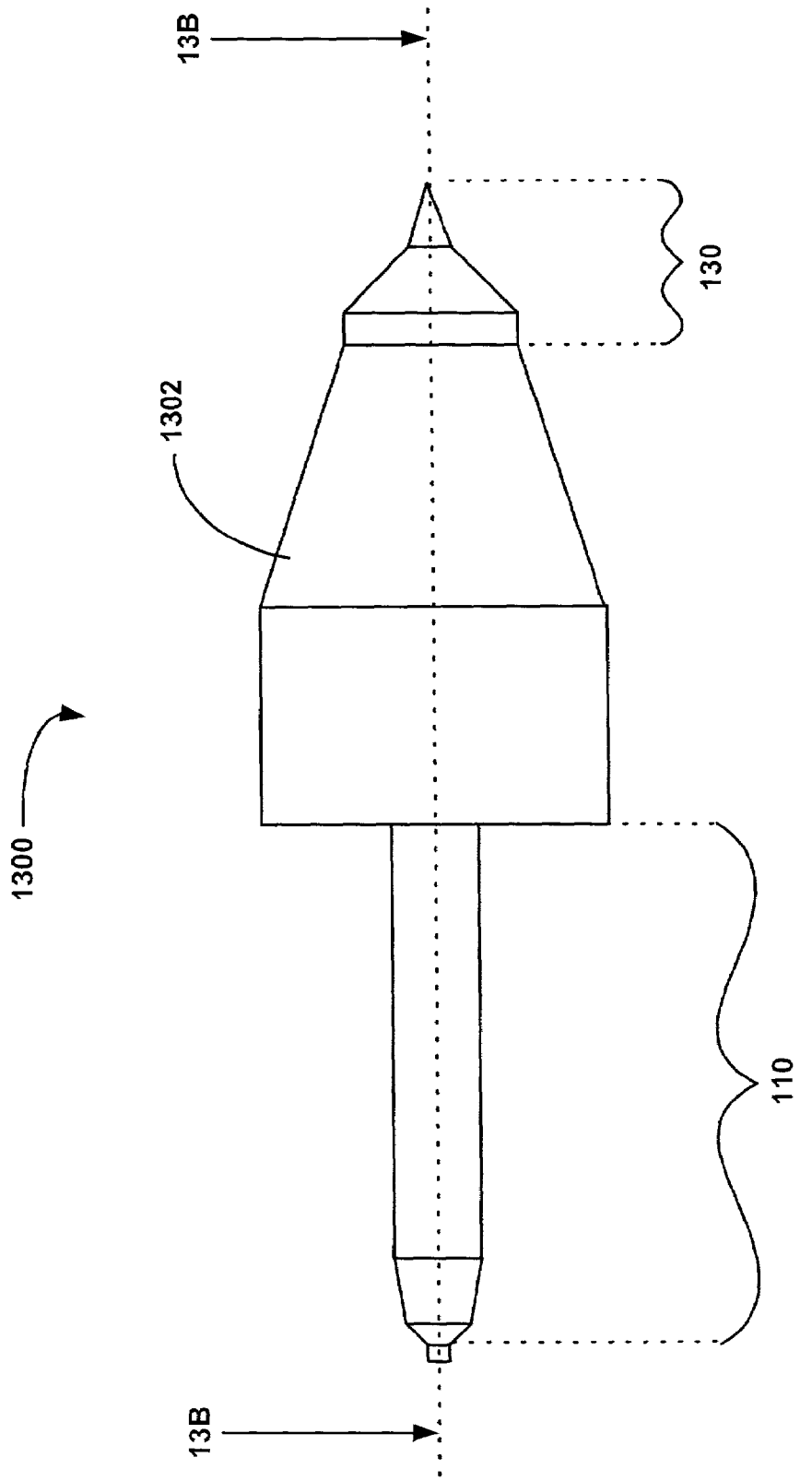
FIG. 13A is a schematic diagram depicting a resistor-pin assembly comprising the resistor-pin assembly shown in FIG. 2.
Figure 13B:
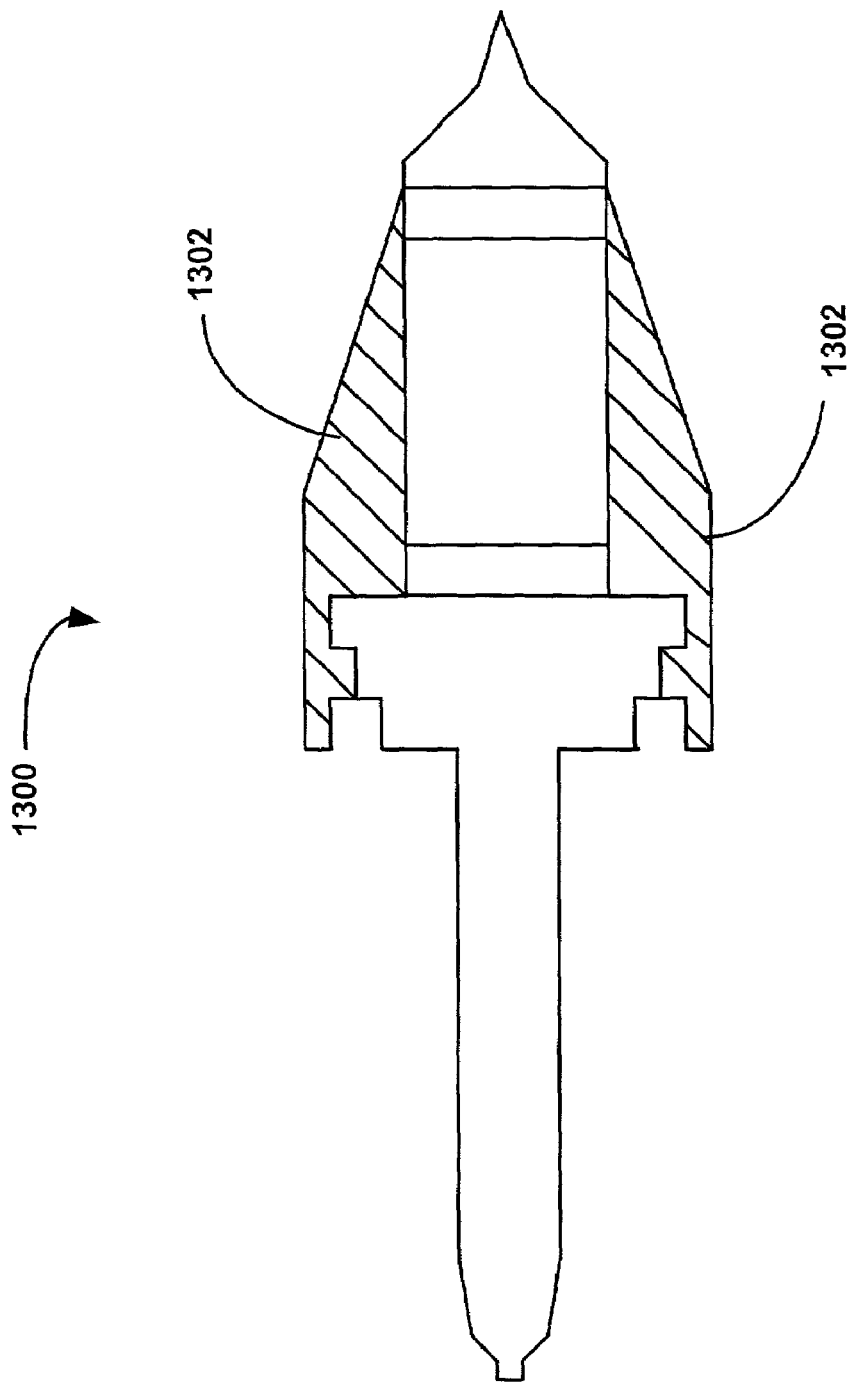
FIG. 13B is a schematic diagram depicting a cross-sectional view of the resistor-pin assembly of FIG. 13A.

FIGS. 13A and 13B are schematic diagrams depicting a side view and a cross-sectional view, respectively, of a resistor-pin assembly 1300. The resistor-pin assembly 1300 comprises the resistor-pin assembly 200 (FIG. 2) and a cast 1302 that covers a portion of the resistor-pin assembly 200. The cast 1302 makes the resistor-pin assembly 1300 more durable and more resistant to breaking. The cast 1302, which may be molded over the resistor-pin assembly 200, may comprise an insulating material such as, for example, but not limited to, plastic. After the resistor-pin assembly 1300 is formed, it may be connected to a voltage probe by placing the shaft 110 into a socket of the voltage probe.

It should be emphasized that the above-described embodiments of the present invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A method for manufacturing a resistor-pin assembly for use in a voltage probe, the method comprising:
    shaping a pin such that the pin comprises a base, a shaft, a neck and a pin-head, the pin head comprising a tip end and an opposing end;
    inserting the pin-head, tip end first, into a first slab;
    separating the pin-head from the base and the shaft by breaking the pin at the neck to expose the opposing end; and
    permanently attaching the pin-head to a resistor.
2. The method of claim 1, further comprising:
    inserting a resistor into a second slab;
    arranging the first and second slabs such that an opposing surface of the tip of the pin-head is closely located with an end of the resistor; and
    permanently attaching the base to the resistor.
3. The method of claim 2, wherein the base and the pin-head are attached to the same resistor.
4. The method of claim 3, wherein the resulting resistor-pin assembly is between 1.0 mm and 1.5 mm in length.
5. The method of claim 2, wherein the base and the pin-head are attached to different resistors.
6. The method of claim 2, wherein the step of permanently attaching the base to the resistor includes placing solder material between the base and the resistor and heating the solder material.
7. The method of claim 2, wherein permanently attaching the base to the resistor comprises arranging the base in a hole within a third slab.
8. The method of claim 7, wherein permanently attaching the base to the resistor comprises placing a washer on the base.
9. The method of claim 8, further comprising:
    inserting a slide into a slot of the third slab.
10. The method of claim 9, further comprising:
    aligning the third slab with a combination of a first slab and a second slab, the combination encompassing the pin-head, the washer, and the resistor.
11. The method of claim 10, further comprising:
    removing the slide from the third slab.
12. The method of claim 11, further comprising:
    introducing a compliant barrier over the shaft.
13. The method of claim 11, further comprising:
    aligning a fourth slab with a combination of the first, second, and third slabs to produce a slab assembly.
14. The method of claim 13, further comprising:
    heating the slab assembly to a temperature that melts the washers.
15. The method of claim 14, further comprising:
    cooling the slab assembly to a temperature that couples the pin-head and the base to the resistor.
16. The method of claim 15, further comprising:
    removing the slab assembly.
17. The method of claim 1, further comprising:
    coating the resistor with a protective cast.
18. The method of claim 17, further comprising:
    coating at least a portion of the base with the protective cast.
19. The method of claim 1, wherein the neck extends between the shaft and the pin-head.
20. The method of claim 1, wherein the step of permanently attaching the pin-head to the resistor includes placing solder material between the pin-head and the resistor and heating the solder material.
21. The method of claim 1, wherein shaping a pin comprises procuring a Beryllium-copper alloy.
22. The method of claim 1, wherein shaping a pin comprises turning a conductive material on a lathe.
23. The method of claim 22, further comprising: treating the conductive material.
24. The method of claim 23, wherein treating the conductive material comprises heating the conductive material.
25. The method of claim 1, wherein the resulting resistor-pin assembly comprises a metal electrode leadless face resistor.
26. The method of claim 1, wherein permanently attaching the pin-head to the resistor comprises arranging a washer comprising solder between the pin-head and the resistor.
27. The method of claim 26, wherein arranging a washer comprises selecting a washer having a thickness of approximately 0.1 mm.
28. The method of claim 26, wherein arranging a washer comprises selecting a washer having a diameter that is substantially equal to a diameter of a cylindrical portion of the pin-head.
29. The method of claim 26, wherein arranging a washer comprises selecting a washer having a layer of flux.
30. The method of claim 1, wherein separating the pin-head from the base and the shaft comprises applying torque to the shaft of the pin.

* * * * *

UNITED STATES PATENT AND TRADEMARK OFFICE
CERTIFICATE OF CORRECTION

PATENT NO. : 7,010,849 B2
APPLICATION NO. : 10/125002
DATED : March 14, 2006
INVENTOR(S) : Kimbley It is certified that error appears in the above-identified patent and that said Letters Patent is hereby corrected as shown below:

On the cover page, item (54), in "Title", in column 1, line 1, delete "METHODS" and insert -- METHOD --, therefor.

On the cover page, item (75), under "Inventor", in column 1, line 2, after "(US)" insert -- ; David J. Dascher, 1260 Scottswood Dr (US) --.

In column 1, line 1, delete "METHODS" and insert -- METHOD --, therefor.

Signed and Sealed this

Twentieth Day of April, 2010

David J. Kappos
*Director of the United States Patent and Trademark Office*

UNITED STATES PATENT AND TRADEMARK OFFICE
Certificate

Patent No. 7,010,849 B2                                                                               Patented: March 14, 2006

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: David Nelson Kimbley, Colorado Springs, CO (US); and David J. Dascher, Colorado Springs, CO (US).

Signed and Sealed this Twenty-fifth Day of May 2010.

<div style="text-align: right;">

DERRIS H. BANKS
*Supervisory Patent Examiner*
Art Unit 3729

</div>